United States Patent [19]
Gesley et al.

[11] Patent Number: 5,304,888
[45] Date of Patent: Apr. 19, 1994

[54] MECHANICALLY STABLE FIELD EMISSION GUN

[75] Inventors: Mark A. Gesley, Oakland; Daniel B. DeBra, Los Altos, both of Calif.

[73] Assignee: ETEC Systems, Inc., Hayward, Calif.

[21] Appl. No.: 828,538

[22] Filed: Jan. 24, 1992

[51] Int. Cl.⁵ .......................... H01J 7/24; H01J 25/02
[52] U.S. Cl. ................................. 313/359.1; 313/289; 315/111.81
[58] Field of Search ...................... 313/359.1, 289, 292; 315/111.81

[56] References Cited
U.S. PATENT DOCUMENTS

| | | | |
|---|---|---|---|
| 4,446,403 | 5/1984 | Cuomo et al. | 315/111.81 |
| 4,748,369 | 5/1988 | Phillips et al. | 313/289 |

Primary Examiner—Sandra L. O'Shea
Attorney, Agent, or Firm—Skjerven, Morrill, MacPherson, Franklin, & Friel

[57] ABSTRACT

An improved electron or ion gun support structure includes a hollow cylinder for rigidly connecting the source assembly to the source-motion ring, with the source cathode and associated lens extending into the hollow portion of the cylinder. The gun is thus made very stable and less susceptible to outside vibrations.

7 Claims, 3 Drawing Sheets

MECHANICALLY STABLE FIELD EMISSION GUN

BACKGROUND OF THE INVENTION

1. Field of the Invention

This invention relates to a mechanical stabilizing structure for particle beam sources, electron or ion (field emission) guns, especially as used in photolithography applications such as semiconductor mask fabrication.

2. Description of the Prior Art

Electron and ion guns are well known. Typically an electron gun includes an electron beam source (also called a cathode) which is held in fixed relation to a magnetic or electrostatic lens assembly for focussing the electron beam. The electrostatic lens assembly is a set of annular electrodes for focussing the electron beam. The source and its support structures are connected to a source-motion ring for small adjustments in electron beam position with respect to the fixed lens.

One prior art source support structure uses a set of three rods extending vertically between the source-motion ring and a source attachment disk from which the source itself is suspended. FIG. 1 shows such a prior art electron gun in an exploded view including gun-module mounting plate (base plate) 1, source-motion ring 2, three source support rods 3, lens assembly 4, lens 5, extractor cap 6, aperture clamp 7, wires 8, spring assembly 9, suppressor 10, suppressor ring clamp 11, high voltage collars 12, source attachment disk 13, high voltage cover connectors 14, filament connectors 15, spring assemblies 16, springs 17, screws 18, screw 19, washers 20, aperture 21, emitter 22, screws 23, screws 24, octupole 25, beam skirt 26, screws 27, 28, cap screws 29, 30, spring assembly connector 31, washers 32, 33, 34, and wire 35. The vertical rods 3 extend between the source-motion ring 2 and the source attachment disk. Alternative prior art source support structures include long rods or cantilevered supports. All such structures are undesirably vulnerable to external vibration, reducing the accuracy of the electron beam.

SUMMARY OF THE INVENTION

The chief object of this invention is to reduce the mechanical vibration of a particle beam source. The difficulty to be overcome is the high sensitivity of such a source to minute mechanical vibrations of the source, particularly in fine focus, high beam resolution applications. These vibrations are exacerbated in electron optical applications with relatively large (unity) gun or column magnifications, (when the system has additional lenses) which then directly transfer the mechanical motion to the target by the resulting motion of the electron beam at the target. This invention is therefore of particular importance in electron beam lithography applications, which use large column magnifications, particularly with field emission-type sources, and also require very precise beam control. The chief advantage to be gained by this invention is greatly improved beam stability at the target of the column, which thereby increases the system accuracy and metrology.

The source is rigidly and efficiently supported on its electron optical axis with respect to the gun lens by a large section-modulus cylindrical support which rigidly connects the source to the lens and constrains its motion with respect to the latter. The cylinder is a source support which is impervious to bending torsional, shear, and axial compression, thereby limiting vibration modes and increasing their frequency by its efficient use of the low mass and high section moment cylindrical support structure. Prior art source supports are columnar, rod-like, or cantilevered and so are much more susceptible to these vibrational modes. This simple-to-fabricate and highly effective support structure significantly improves the performance of a field emission gun by reducing its susceptibility to vibration and increasing its characteristic frequency.

DETAILED DESCRIPTION OF INVENTION

Figure 1:
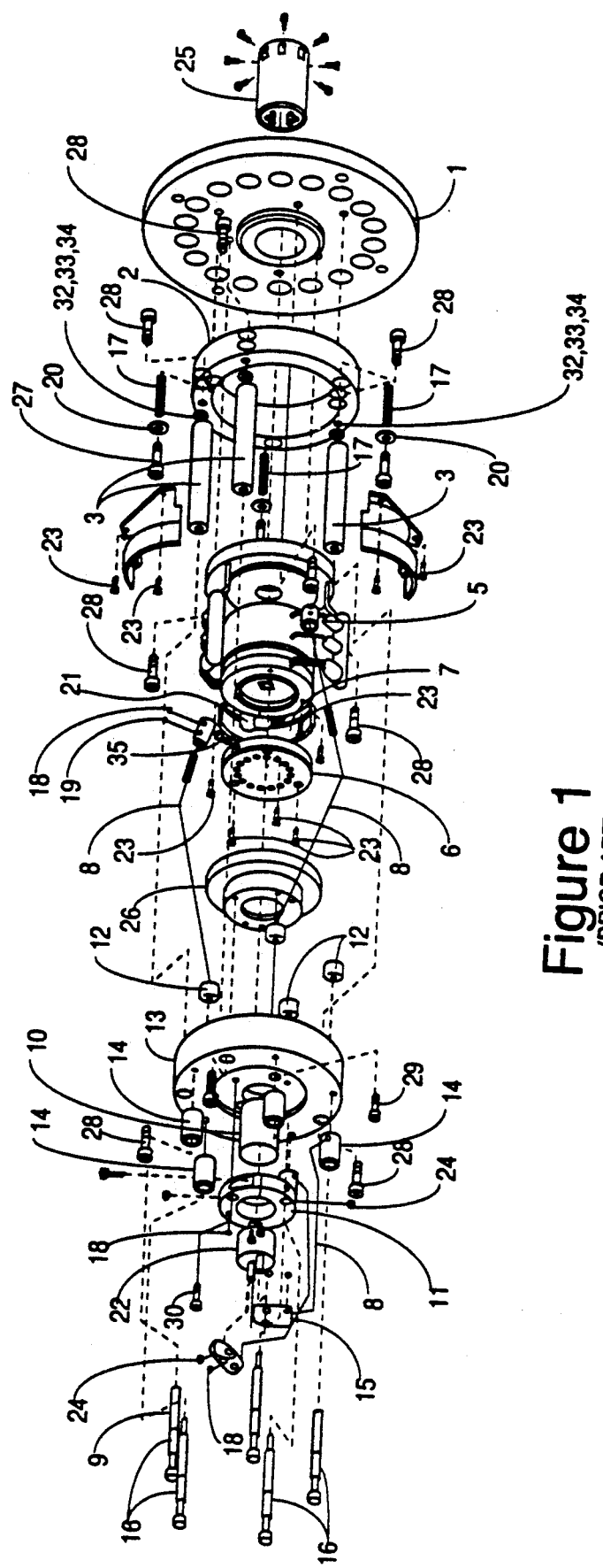
FIG. 1 shows a prior art electron gun.
Figure 2:
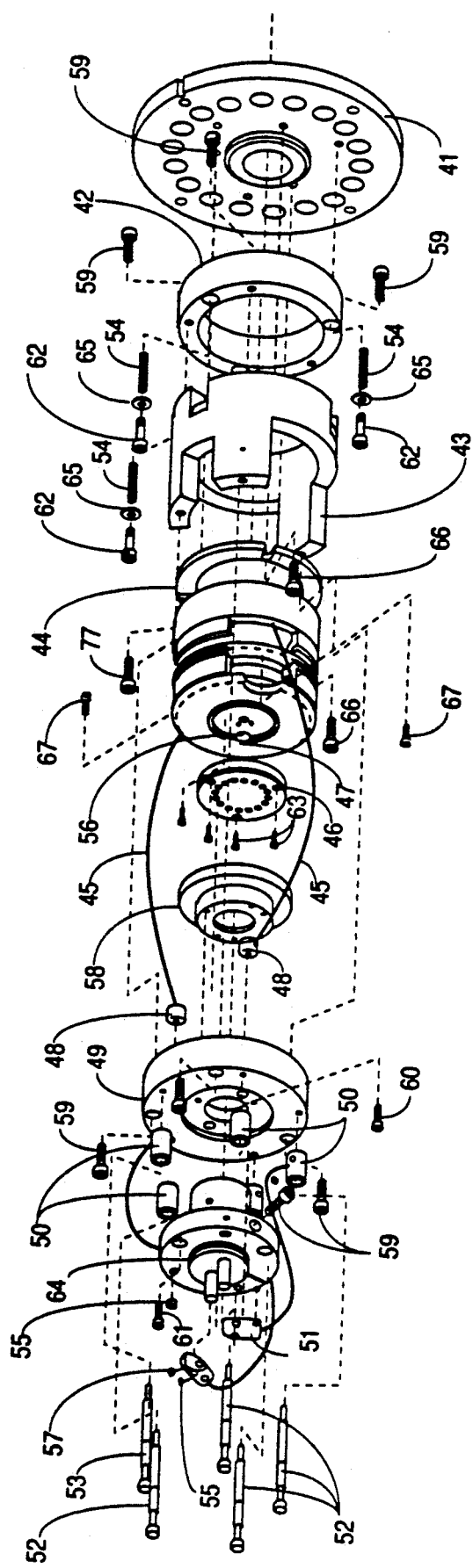
FIG. 2 shows an electron gun in accordance with the invention.

FIG. 2 shows the field emission (electron) gun assembly which includes a source assembly which holds the cathode (emitter). The cathode is the physical source of electrons and is the element that is to be held rigidly with respect to the lens module baseplate, thereby reducing the relative motion of the source with respect to the lens assembly, which is also rigidly attached to the baseplate. A compatible lens assembly is described in a copending and commonly owned patent application (Mark A. Gesley, Ser. No. 07/671,425; filed Mar. 4, 1991 "Low aberration field emission electron gun") now U.S. Pat. No. 5,196,707, issued Mar. 23, 1993. The present invention is also compatible with other lens assemblies.

The gun components as shown in FIG. 2 are the baseplate 41, the source motion ring 42, the cylindrical source support 43, the disk 44 on which is stacked the lens assembly, wires 45, extractor cap 46, aperture clamp 47, high voltage collar 48, source attachment disk 49, high voltage connector covers 50, filament connectors 51, spring assembly connectors 52, spring assembly 53, mounting springs 54, set screws 55, aperture 56, set screws 57, high voltage skirt 58, cap screws 59, 60, 61, socket head screws 62, cap screws 63, emitter 64, washers 65, and column mount screws 66, and 67. FIG. 2 is an exploded view with the assembly indicated by the dotted lines. The three cut-outs in the upper portion of cylindrical source support 43 are for electrical lead access and pyrometer viewing access. The cut-outs shown in the lower portion of the cylindrical source support 43 are for accommodation of the assembly screws as shown.

The source assembly thus is rigidly attached to the Macor TM (a commercially available machinable ceramic) source-attachment disk 49. This disk 49 is rigidly attached to the cylindrical source support 43 (also of Macor but which may be another mechanically rigid and electrically insulative material) which has an annular cross-section having a thickness defined by the outer diameter of the source motion 42 ring and an inner diameter sized to accommodate the lens assembly outer diameter plus allow for the translation motion of the entire moveable source-motion assembly (consisting of the source assembly, cathode 64, source-support disk 44, cylindrical source support 43, and source-motion ring 42), which motion is typically 1 mm. The lens (stacked on disk 44) is attached by screws 66 to baseplate 41.

Figure 3D:
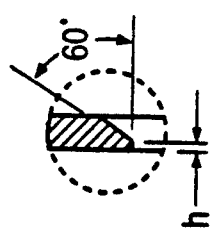
FIGS. 3a, 3b, 3c, 3d show views of a cylindrical source support in accordance with the invention.
Figure 3C:
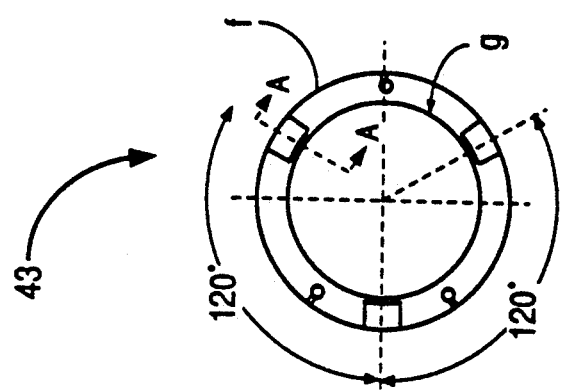
Figure 3B:
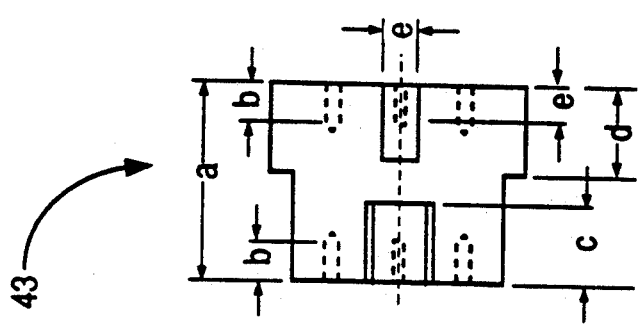
Figure 3A:
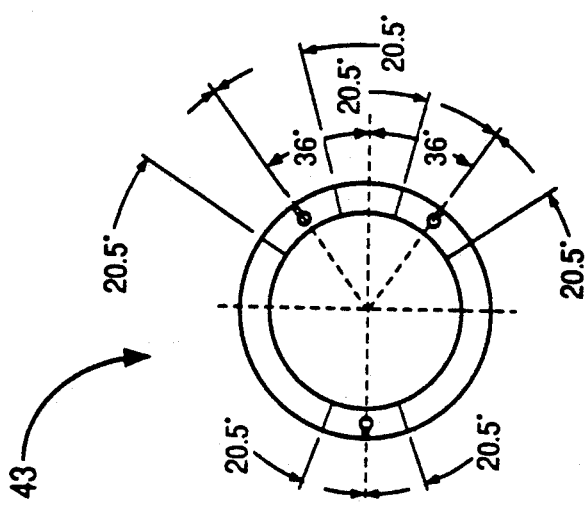

FIGS. 3a, 3b, 3c, and 3d are views of the cylindrical source support 43 of FIG. 2. FIG. 3a is a top view showing the angular locations of the cut-outs and the screw holes. FIG. 3b is a side view of the same structure with the screw holes shown in dotted lines. The dimensions are as follows: dimension a (the height) is 1.675 inches; dimension b (the depth of the screws holes) is 0.325 inches; dimension c (the depth of the upper cutouts) is 0.675 inches; dimension d (the total depth of the lower cutouts) is 0.75 inches; and dimension e (the width of the lower cutouts and upper depth of the lower cutouts) is 0.30 inches.

FIG. 3c is an end view of the bottom of the cylindrical source support 43. Dimension f (the overall outside diameter) is 2.50 inches. Dimension g (the inner diameter) is 1.65 inches. FIG. 3d is a section along line AA of FIG. 3c and shows detail of each of the lower cutouts which as shown are shaped so as to put an angle on the edge of the cutout, with the thickness of the material at the inner portion of the cutout being dimension h which is 0.06 inches. The various screw holes are threaded to accommodate the threads of the associated screws. Cylindrical support assembly 43 is conventionally machined from Macor material.

A key advantage of this assembly is that it provides the most efficient structure for resisting bending. The cylindrical geometry of the source support has the largest possible section modulus, i.e. bending moment per applied bending stress, of any geometry. The annular cylinder geometry also easily accommodates the lens portion of the gun assembly which focuses the emitted particle beam. Bending resistance translates into greater beam positional stability at the image plane because applied external forces produce smaller source positional displacements. The efficiency of the structure also means a lighter weight assembly results in higher natural frequencies, which typically have less of an effect in imaging, lithography, and metrology applications. Thus the influence of rocking modes of vibration have a reduced effect in this structure.

Another advantage of using a rigid, annular, cylindrical geometry is that torsional modes of vibration are greatly reduced because of the constrained degree of freedom, compared to using the prior art separate rod-like supports.

Another key advantage of this structure is the increased contact area between the source-attachment disk 49 and the cylindrical source support 43, and also between the source motion ring 42 and the cylindrical source support 43 afforded by the cylindrical geometry of the source support 43. In this manner shear and rocking modes are further reduced. The number and area of the cutouts in source support 43 is kept to a minimum. The cylinder 43 is rigidly attached (see FIG. 2) to the source motion ring 42, which is held under tension by the internal springs 54 and screws 59, 62 as shown to the baseplate 41.

This disclosure is illustrative and not limiting; further modifications will be apparent to one of ordinary skill in the art in light of this disclosure and the appended claims. For instance, in another embodiment the cylindrical source support is rigidly attached to the baseplate, omitting the source-motion ring.

We claim:

1. A mechanically stable emissive gun assembly including a particle beam source and a lens comprising:
   a cylindrical annular source support attached at one end to the source, and defining a central cavity for accommodating the lens;
   a source-motion ring attached to the other end of the source support;
   means for providing translation motion of the source with respect to the lens; and
   a base plate attached to the source-motion ring, the baseplate supporting the lens.

2. The device of claim 1, wherein the source support is formed of a machinable ceramic.

3. A mechanically stable emissive gun assembly including a particle beam source and a lens and comprising:
   a cylindrical annular source support attached at one end to the source, and defining a central cavity for accommodating the lens;
   a mechanical adjustment disposed between the source-motion ring and the source support wherein the mechanical adjustment permits translation motion of the source with respect to the lens; and
   a baseplate attached to the other end of the source support, the baseplate supporting the lens.

4. The device of claim 3, wherein the source support is formed of a machinable ceramic.

5. The apparatus of claim 1 wherein the means for providing translation motion provides about one millimeter translation motion of the source with respect to the lens.

6. A mechanically stable emissive gun assembly comprising:
   a particle beam source that generates a particle beam;
   a lens assembly that focuses the particle beam into a fine focus;
   a source support of a cylindrical annular shape that defines a central cavity for accommodating the lens, wherein:
   the source support has a first end and a second end opposite the first end, the first end supporting the source,
   the source support defines a plurality of first cutouts at the first end to provide access,
   the source support defines plurality of cut-outs at the second end, thereby to accommodate a plurality assembly screws, and
   the source support is of sufficient annular thickness to provide a large section-modulus, whereby the source support is impervious to bending, torsional, shear and axial compression;
   a source-motion ring attached at the second end of the source support;
   a baseplate attached to the second end of the source support, the baseplate supporting the lens assembly; and
   a mechanical adjustment disposed adjacent the source-motion ring, between the second end of the source support and the baseplate, wherein the mechanical adjustment provides precise control of the finely focused particle beam by permitting an about one millimeter translation motion of the source with respect to the baseplate.

7. The device of claim 6, wherein the source support is formed of a mechanically rigid, electrically insulative, machinable ceramic.

* * * * *